Jan. 29, 1952 W. R. HEWLETT 2,583,943
MODIFIED WIEN-BRIDGE OSCILLATOR
Filed Jan. 10, 1947 2 SHEETS—SHEET 1
FIG. 1
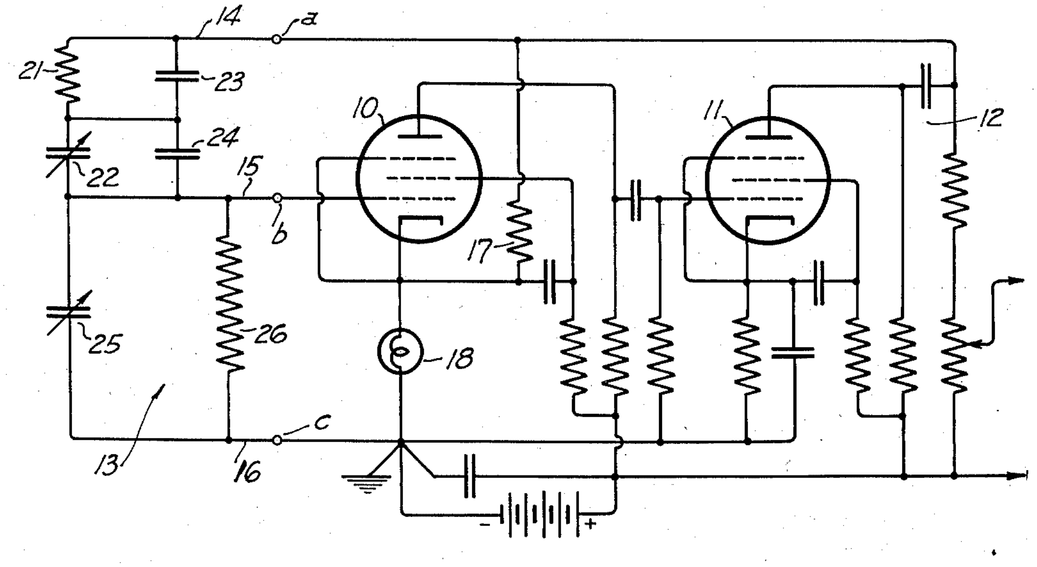
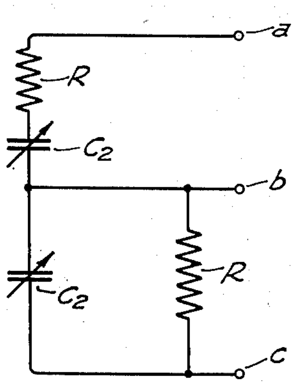
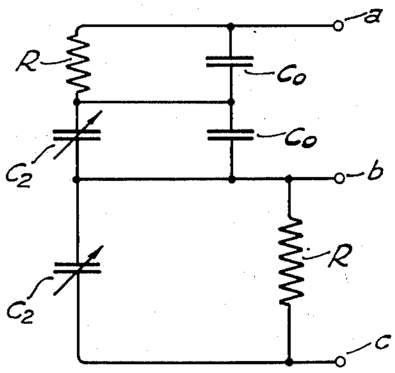
FIG. 2 FIG. 3
INVENTOR.
William R. Hewlett
BY Paul D Flehr
ATTORNEY INVENTOR.
William R. Hewlett
BY Paul D. Flehr
ATTORNEY Patented Jan. 29, 1952

2,583,943

UNITED STATES PATENT OFFICE 2,583,943

MODIFIED WIEN-BRIDGE OSCILLATOR

William R. Hewlett, Palo Alto, Calif., assignor, by mesne assignments, to Hewlett-Packard Company, Palo Alto, Calif., a corporation of California Application January 10, 1947, Serial No. 721,219

3 Claims. (Cl. 250—36)

This invention relates generally to variable frequency oscillation generators, and particularly to generators which are relatively stable as to the selected frequency of operation.

In my Patent No. 2,268,872 there is disclosed an oscillation generator which can be adjusted over a wide frequency range, and which has a high degree of stability for the frequency selected. In its preferred form this generator consists of a two stage resistance coupled amplifier to which both positive and negative feedback are applied. The positive feedback is provided by a network which serves to control the frequency of operation and which consists of a selective resistance-capacitance combination. The negative feedback circuit employs a non-linear element which is generally a suitable ballast lamp, and which serves to control the amount of negative feedback responsive to the amplitude of oscillation. In practice two capacitance elements of the positive feedback network are made variable, and the resistances are made adjustable, whereby combinations can be had affording a range of frequency operation from say 6 cycles to 600 kilocycles per second. In certain instances it is desirable to extend the frequency range of operation to higher frequencies. Likewise it is desirable for some purposes to extend the lower frequency limit. It is further desirable to obtain a greater ratio between maximum-minimum frequency of any frequency range than can be obtained with normal variable condensers. In order to be commercially feasible such extensions of the frequency range must be accomplished without undue electrical complications, and without sacrificing the desired frequency stability.

In general it is an object of the invention to provide an oscillation generator of the above character having a positive feedback network which is adjustable over a wider range of frequencies than heretofore deemed possible.

It is an object of the present invention to provide an improved oscillation generator of the above type which will effectively extend the upper limit of the frequency range.

A further object of the invention is to provide an oscillation generator of the above type which will enable an extension of the lower frequency limit.

A further object of the invention is to provide an oscillation generator of the above type which will enable a greater ratio to be obtained between maximum and minimum frequency on any given range than could be normally obtained with the existing variable condensers.

Further objects of the invention will appear from the following description in which the preferred embodiments have been set forth in detail in conjunction with the accompanying drawing.

Referring to the drawing:

Figure 1 is a circuit diagram illustrating one embodiment of the invention.

Figure 2 is a circuit diagram illustrating a selective network of the type disclosed in Patent 2,268,872.

Figure 3 is a circuit diagram illustrating the selective network incorporated in Figure 1, but with the various resistance and capacity elements designated by symbols to facilitate a mathematical explanation.

Figures 4, 5, 6:
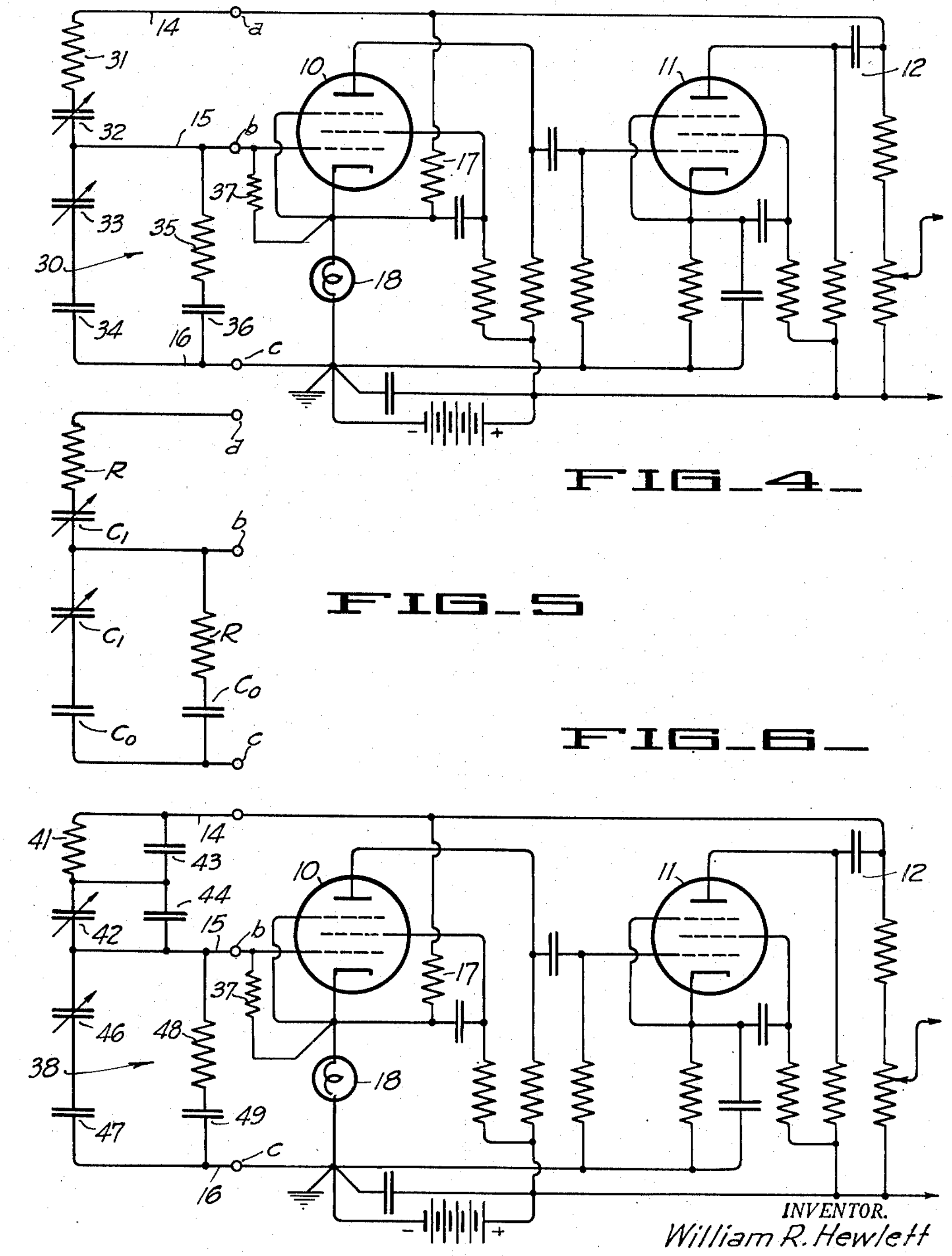
Figure 4 is a circuit diagram similar to Figure 1 but showing another embodiment of the invention.
Figure 5 is a circuit diagram illustrating the selective network utilized in Figure 4, but with symbols applied to the resistance and capacity elements to facilitate mathematical explanation.
Figure 6 is a circuit diagram similar to Figure 1 but illustrating another embodiment of the invention.

Referring first to the embodiment of the invention illustrated in Figure 1, I have shown an oscillation generator consisting of the vacuum tube amplifiers 10 and 11, coupled together by resistance elements in a manner well known to those skilled in the art. In practice tube 10 can be of the type known by manufacturers' specifications as No. 6J7, and tube 11 No. 6F6. The plate of tube 10 is coupled to the control grid of tube 11, and the plate of tube 11 is coupled through a condenser 12 with a selective network designated generally at 13. The three points of connection *a*, *b* and *c* between the network 13 and the remainder of the oscillation generator represent respectively a point on the conductor 14 which leads to the coupling condenser 12, a point on conductor 15 which leads to the control grid of tube 10, and a point on the grounded conductor 16. As will be presently explained the network 13 includes resistance and capacity elements connected in combination in such a fashion as to permit positive feedback to maintain oscillation and to provide a desired frequency of operation.

In order to stabilize operation of the generator a negative feedback is used which includes a linear resistance 17 connected between the cathode of tube 10 and conductor 14, and a non-linear resistance 18 in the form of a small incandescent lamp or ballast lamp, which is connected between the cathode of tube 10 and conductor 16. Thus when potential differences exist between points *a* and *b* current flow occurs through 17 and 18, to afford a negative feedback, and the amount of such negative feedback can be adjusted by changing the value of resistance 17. As disclosed in Patent 2,268,872 such an arrangement serves to automatically control the amplitude of oscillation, and this in turn serves to stabilize and maintain constant the frequency of operation for a given setting of the resistance-capacitance values of the network 13. In addition to or in place of, providing a nonlinear resistance 18 of the type described the resistor 17 can be nonlinear and of the type whose resistance decreases with increase in current. Such resistors are available on the market under the trade name of "Thermistor."

The network 13 of Figure 1 consists of one circuit formed by resistance 21, variable condenser 22, and condensers 23 and 24. A second circuit of the network includes variable condenser 25 and resistance 26. Resistance 21 and condenser 22 are in a series, and are each shunted by condensers 23 and 24.

An explanation of the above network can best be understood after reviewing the network illustrated in Figure 2, which is the same as that illustrated in my Patent 2,268,872. Using the symbols appearing in this view the frequency of operation can be expressed by an equation as follows:

Equation 1 $$f=\frac{1}{2\pi RC_2}$$

The above assumes that the two resistances have the same value and that the condensers have the same values and range of variation. It is evident from Equation 1 that as the value of each of the two condensers is decreased the frequency of operation is increased. In a typical instance where the two resistors each have a value of 1 megohm, and the two condensers each provide a capacitance range from 500 mmfd. to 50 mmfd., the range of selected frequencies is from 318 c. p. s. (cycles per second) to 3180 c. p. s. For the particular values stated, or for any values which may be stated by way of example, there is a practical limit to the maximum permissible frequency of operation. Furthermore, it is evident from Equation 1 that the frequency is inversely proportional to the capacity and, therefore, the ratio between the maximum and minimum frequencies available on a single range is determined by the maximum to the minimum capacity ratio available from the variable condenser. The arrangement of Figure 1 however permits an extension of the upper frequency limit, with a given value of fixed resistance and variable capacity and increases the ratio of maximum to minimum frequency to a value greater than the ratio of a maximum to minimum capacity of the variable condenser.

In Figure 3 the network 13 of Figure 1 has been repeated and the various resistors and condensers have been given symbols. The assumption is made that the two resistors 21 and 26 have the same value R, that the condensers 23 and 24 have the same value $C_0$, and that the variable condensers 22 and 25 are adjusted to the same capacitance $C_2$. The frequency of operation of this network can be expressed by an equation as follows:

Equation 2 $$f=\frac{1}{2\pi RC_2}\cdot\frac{1}{\sqrt{1-2\left(\frac{C_0}{C_2}\right)^2}}$$

It will be evident from Equation 2 that the use of condensers 23 and 24 makes possible a substantial extension of the higher frequency limit, while at the same time permitting frequencies down to lower limits the same as for Figure 2. Assuming for example that the value of the two resistors 21 and 26 is 1 megohm, that condensers 22 and 25 have a permissible range of adjustment between 500 mmfd. to 50 mmfd., and that condensers 23 and 24 have a value of 33.3 mmfd., the frequency range according to Equation 2 is from 318 c. p. s. to 9540 c. p. s. This increased frequency range is obtained without sacrificing stability of operation for a given adjustment.

The embodiment of Figure 4 is desirable in instances where it is desired to extend the lower frequency limit beyond the values feasible with the network of Figure 2. In this instance the selective resistance-capacity network is designated generally at 30, and includes a circuit consisting of resistor 31 and variable condenser 32, which are connected in series between conductors 14 and 15, and another circuit formed by condensers 33 and 34, resistor 35 and condenser 36. Condensers 33 and 34 are serially connected between conductors 15 and 16, and resistor 35 is serially connected with condenser 36 between conductors 15 and 16. The customary high resistance grid leak 37 can be connected from the control grid to the cathode of tube 10. Such a grid leak will not have any effect upon the frequency characteristics of the network 13.

Figure 5 illustrates the same network 30 with symbols applied to the various resistance and capacity elements. It is assumed that resistors 31 and 35 are of equal value, that condensers 33 and 34 have the same capacitance values for a given setting, and that condensers 34 and 36 are of the same value. The frequency of operation of such a network can be represented by an equation as follows:

Equation 3 $$f=\frac{1}{2\pi RC_1}\sqrt{1-2\left(\frac{C_1}{C_0}\right)^2}$$

Assuming for example that R represents a resistance of 1 megohm, $C_1$ capacitances adjustable between 500 mmfd. and 50 mmfd., and $C_0$ capacitances of 750 mmfd., then by adjusting $C_1$, that is by simultaneously adjusting condensers 32 and 33, the operating frequency can be varied from 106 c. p. s. to 3180 c. p. s. As previously explained in connection with Figure 2, for the same values of R and $C_2$ in Figure 2 ($C_2$ in Figure 2 corresponding to $C_0$ in Figure 5) the range of operation was from 318 c. p. s. to 3180 c. p. s. Therefore the arrangement of Figure 4 enables a substantial extension of the lower frequency limit, while at the same time permitting frequencies to the same upper limit as for Figure 2.

In the embodiment of Figure 6 the selective resistance-capacitive network 38 combines the features of both Figures 1 and 4, whereby both the low and high frequency limits are substantially extended. The network 38 in this instance includes one circuit formed by resistance 41, variable condenser 42, and fixed condensers 43 and 44. Resistor 41 and condenser 42 are in series and are connected between conductors 14 and 15. Condensers 43 and 44 are shunted across resistor 41 and condenser 42 respectively. A second circuit consists of variable condenser 46, fixed condenser 47, resistor 48, and condenser 49. Condensers 46 and 47 are in series and connected between conductors 15 and 16, and resistor 48 and condenser 49 are likewise serially connected between the same conductors. As in the case of Figure 4, the customary high resistance grid leak can be connected from the control grid to the cathode of tube 10. Assuming an example to provide a comparison with the preceding embodiments, resistor 41 can have a value of 1 megohm, condenser 42 a range of adjustment from 500 mmfd. to 50 mmfd., condensers 43, 44 a value of 33.3 mmfd., condenser 46 a range of adjustment from 500 mmfd. to 50 mmfd., condenser 47, 750 mmfd., resistor 48 1 megohm, and condenser 49, 750 mmfd. Over the range of adjustment of condensers 42 and 46 the frequency of operation will be from 106 c. p. s. to 9540 c. p. s. Thus this embodiment provides an extension of both the high and low frequency limits as compared to the network of Figure 2. For the higher frequencies the network 38 of Figure 6 operates substantially the same as the network 13 of Figure 1, and its frequency of operation is determined generally by Equation 2. In other words for the higher frequencies the condenser 49 does not materially change the frequency of the network. For the relatively low frequencies the network operates like the network 30 of Figure 4, and in accordance with Equation 3. In other words for such frequencies the condensers 47 and 49 have a material effect on the frequency of operation, because with a condenser whose maximum to minimum capacity ratio is 10:1, a maximum to minimum frequency ratio of 90:1 has been obtained.

The preceding formulas have been derived on the basis of equal values of the fixed condensers, of the variable condensers and of the fixed resistors. The preceding modifications are not limited, however, to this condition but merely require that the product of the variable condenser and the fixed resistor between points *a* and *b* in Figure 1 and Figure 4 equal the product of the fixed resistor and variable condenser between points *b* and *c*.

I claim:

1. A selective network for forming a positive feedback from the output to the input of an oscillation generator of the type utilizing electronic amplifying means having an input control grid and an output plate circuit, said network comprising resistance and capacitance elements forming two circuits, one circuit being connected between two conductors, the first of said two conductors being coupled to the plate circuit and the second being connected to the control grid, the other circuit being connected between said second conductor and a third conductor which is connected to a point of neutral potential, the first circuit comprising a resistor and a variable condenser connected serially between the first and second conductors together with a fixed condenser shunted across the resistor and a second fixed condenser shunted across the variable condenser, the second circuit comprising elements forming two paths connected in shunt between the second and third conductors, one path including a variable condenser and the other a resistor, said network affording a relatively wide frequency range of operation upon adjustment of said variable condensers, the frequency of operation for a substantial portion of said range being in accordance with the equation $$f=\frac{1}{2\pi RC_2}\cdot\frac{1}{\sqrt{1-2\left(\frac{C_0}{C_2}\right)^2}}$$

where R represents the resistance value of each of the resistors mentioned, $C_2$ represents the capacitance value of each of the variable condensers for a given adjustment, $C_0$ represents the capacitance value of each of the two fixed condensers of the first named circuit, and $f$ represents the frequency of operation.

2. A frequency determining network for forming a positive feedback from the output to the input of an oscillation generator of the type utilizing electronic amplifying means having an input control grid and an output plate circuit, said network comprising resistance and capacitance elements forming two circuits, the circuits being connected between two conductors, the first of said two conductors being coupled to the plate circuit and the second being connected to the control grid, the other circuit being connected between said second conductor and a third conductor which is connected to a point of neutral potential, the first circuit including at least one resistor and a variable condenser connected in series between the first and second conductors, the second circuit comprising a variable condenser and a relatively fixed condenser serially connected between the second and third conductors together with a resistor and a fixed condenser likewise serially connected between the second and third conductors, said network being adjustable over a relatively wide frequency range by varying the capacitance of the two variable condensers, the frequency of operation conforming substantially to the equation $$f=\frac{1}{2\pi RC_1}\sqrt{1-2\left(\frac{C_1}{C_0}\right)^2}$$

where R represents the resistance value of the two resistors mentioned, $C_1$ represents the adjusted value of each of the variable condensers, and $C_0$ represents the capacitance of each of the fixed condensers of the second circuit.

3. A frequency determining network for forming a positive feedback from the output to the input of an oscillation generator of the type utilizing electronic amplifying means having an input control grid and an output plate circuit, said network comprising resistance and capacitance elements forming two circuits, one circuit being connected to two conductors, the first of said two conductors being coupled to the output and the second being connected to the control grid of the amplifying means, the other circuit being connected between said second conductor and a third conductor which is connected to a point of neutral potential, the first circuit comprising a resistor and a variable condenser connected serially between the first and second conductors together with a fixed condenser shunted across the resistor and a second fixed condenser shunted across the variable condenser, the second circuit comprising a variable condenser and a fixed condenser connected in series between the second and third conductors together with a resistor and a fixed condenser connected in series between the second and third conductors, adjustment of said variable condensers serving to vary the frequency of operation over a relatively wide frequency range, the frequency of operation for the higher portion of said range conforming to the equation $$f=\frac{1}{2\pi RC_2}\cdot\frac{1}{\sqrt{1-2\left(\frac{C_0}{C_2}\right)^2}}$$

where R represents the value of each of the two resistors mentioned, $C_2$ represents the value of each of the variable condensers for a given adjustment, $C_0$ represents the capacitance of each of the two fixed condensers of the first circuit, and $f$ represents the frequency of operation for the lower portion of said range conforming to the equation $$f=\frac{1}{2\pi RC_1}\sqrt{1-2\left(\frac{C_1}{C_0}\right)^2}$$

where R represents the resistance value of each of the two resistors mentioned, $C_1$ represents the adjusted value of each of the variable condensers, and $C_0$ represents the capacitance of each of the fixed condensers of the second circuit.

WILLIAM R. HEWLETT.

REFERENCES CITED

The following references are of record in the file of this patent:

UNITED STATES PATENTS

| Number | Name | Date |
|---|---|---|
| 2,072,946 | Farnham | Mar. 9, 1937 |
| 2,093,665 | Tellegen | Sept. 21, 1937 |
| 2,268,872 | Hewlett | Jan. 6, 1942 |
| 2,298,177 | Scott | Oct. 6, 1942 |
| 2,354,141 | Purington | July 18, 1944 |
| 2,444,084 | Artzt | June 29, 1948 |
| 2,446,821 | Gassel et al. | Aug. 10, 1948 |

FOREIGN PATENTS

| Number | Country | Date |
|---|---|---|
| 524,314 | Great Britain | Aug. 2, 1940 |